United States Patent

Cacharelis

[11] Patent Number: 5,591,658
[45] Date of Patent: Jan. 7, 1997

[54] METHOD OF FABRICATING INTEGRATED CIRCUIT CHIP CONTAINING EEPROM AND CAPACITOR

[75] Inventor: Philip J. Cacharelis, Menlo Park, Calif.

[73] Assignee: National Semiconductor Corporation, Santa Clara, Calif.

[21] Appl. No.: 469,575

[22] Filed: Jun. 6, 1995

Related U.S. Application Data

[62] Division of Ser. No. 298,239, Aug. 30, 1994, abandoned.

[51] Int. Cl.[6] .............................................. H01L 21/8247
[52] U.S. Cl. ............................................ 437/43; 437/52
[58] Field of Search ........................ 437/43, 984, 48, 437/52

[56] References Cited

U.S. PATENT DOCUMENTS

| | | | |
|---|---|---|---|
| 4,688,078 | 8/1987 | Hseih | 257/317 |
| 4,780,431 | 10/1988 | Maggioni et al. | 437/52 |
| 4,851,361 | 7/1989 | Schumann et al. | 437/30 |
| 4,859,619 | 8/1989 | Wu et al. | 437/43 |
| 4,931,847 | 6/1990 | Corda | 357/23.5 |
| 5,014,098 | 5/1991 | Schlais | 357/23.5 |
| 5,021,848 | 6/1991 | Chiu | 357/23.5 |
| 5,036,018 | 7/1991 | Mazzali | 437/43 |
| 5,057,448 | 10/1991 | Kuroda | 437/52 |
| 5,243,210 | 9/1993 | Naruke | 257/320 |
| 5,292,681 | 3/1994 | Lee et al. | 437/48 |
| 5,464,784 | 11/1995 | Crisenza et al. | 437/43 |

FOREIGN PATENT DOCUMENTS

| | | | |
|---|---|---|---|
| 0256993 | 2/1988 | European Pat. Off. | H01L 29/78 |
| 0435534A3 | 7/1991 | European Pat. Off. | H01L 21/82 |
| 0440265A2 | 8/1991 | European Pat. Off. | G11C 17/00 |
| 56-124272 | 9/1981 | Japan | H01L 21/90 |
| A62219576 | 9/1987 | Japan | H01L 29/78 |
| A1145868 | 6/1989 | Japan | H01L 27/10 |

*Primary Examiner*—H. Jey Tsai
*Attorney, Agent, or Firm*—Skjerven, Morrill, MacPherson, Franklin & Friel; David E. Steuber

[57] ABSTRACT

An EEPROM cell is formed in an IC chip by using only three masking steps in addition to those required for the basic CMOS transistors in the chip. A first mask layer is used to define source/drain regions of select and memory transistors within the EEPROM cell; a second mask layer is used to define a tunneling region of the memory transistor; and a third mask layer is used to define a floating gate of the memory transistor and a gate of the select transistor. A control gate of the memory transistor is formed using the same mask that is used to define the gates of the CMOS transistors. The third and fourth mask layers may also be used to form the lower and upper electrodes, respectively, of a capacitor.

4 Claims, 23 Drawing Sheets

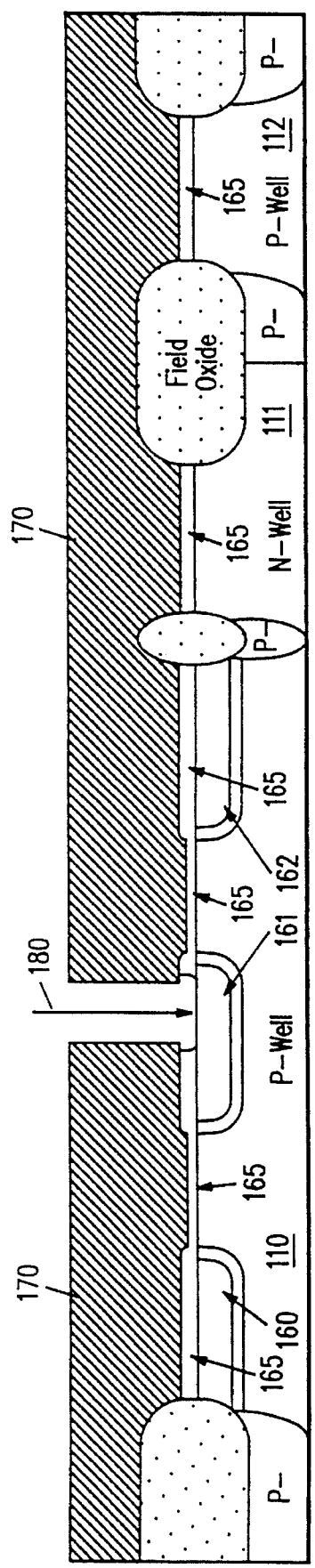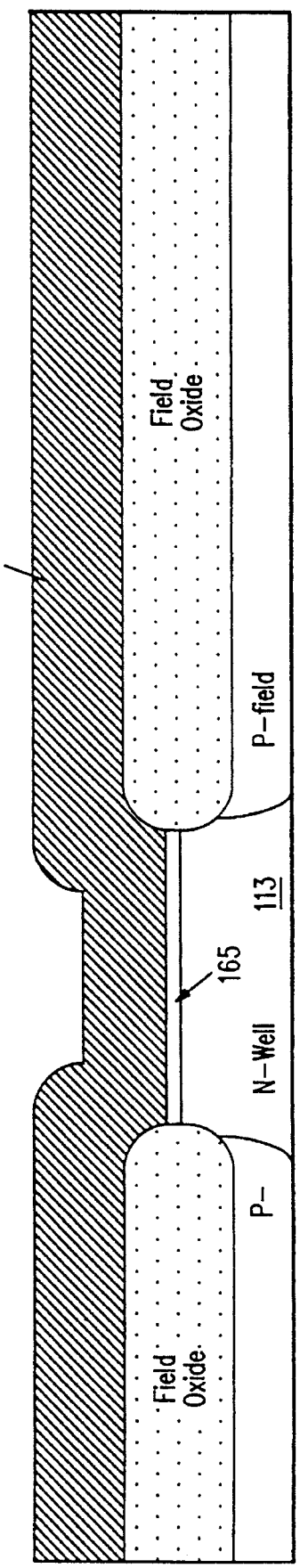
FIG. 4A
FIG. 4B

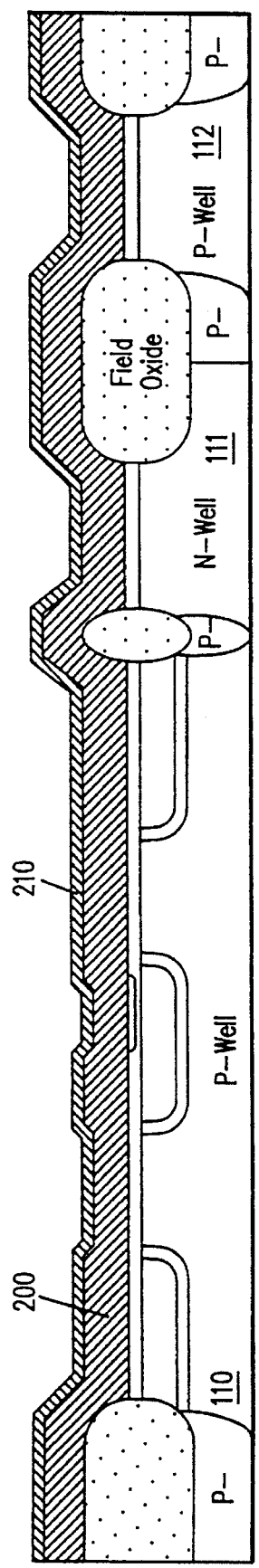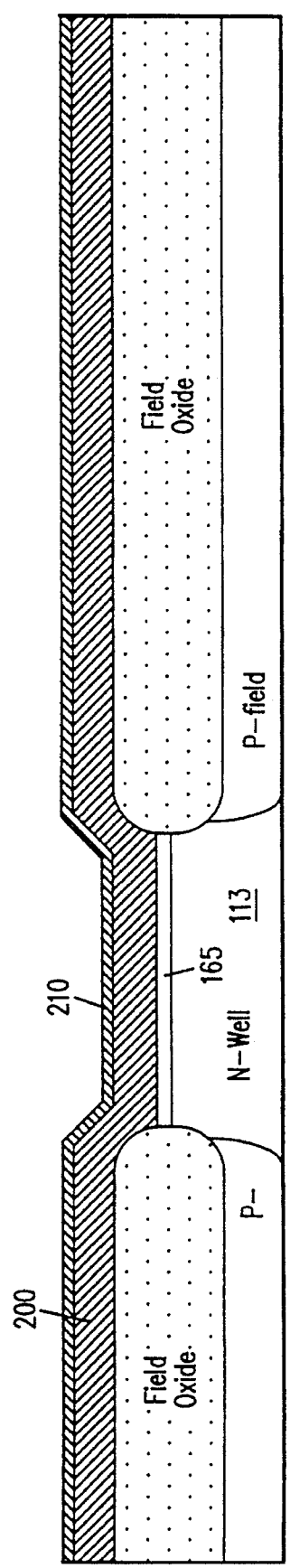
FIG. 6A
FIG. 6B

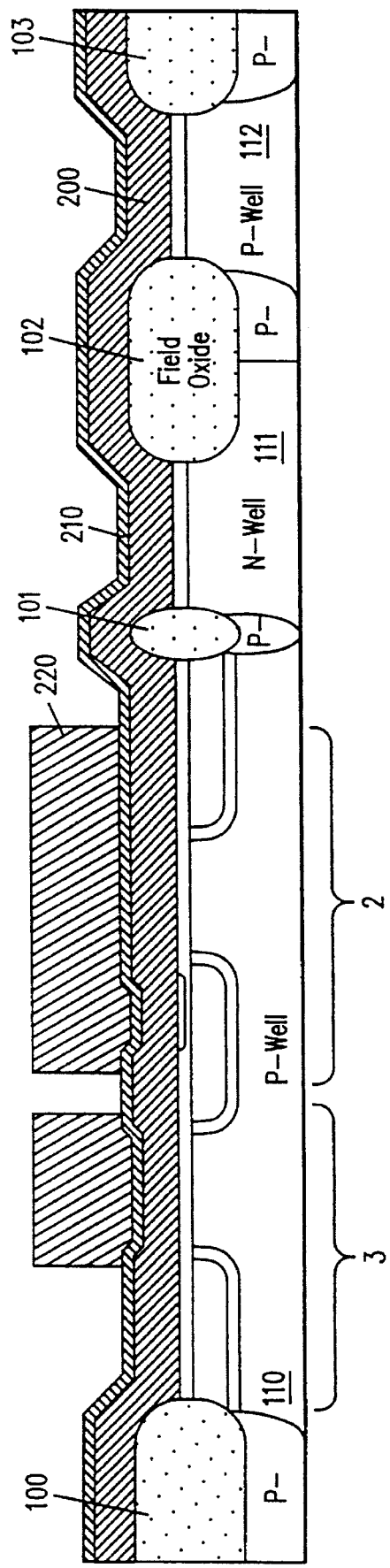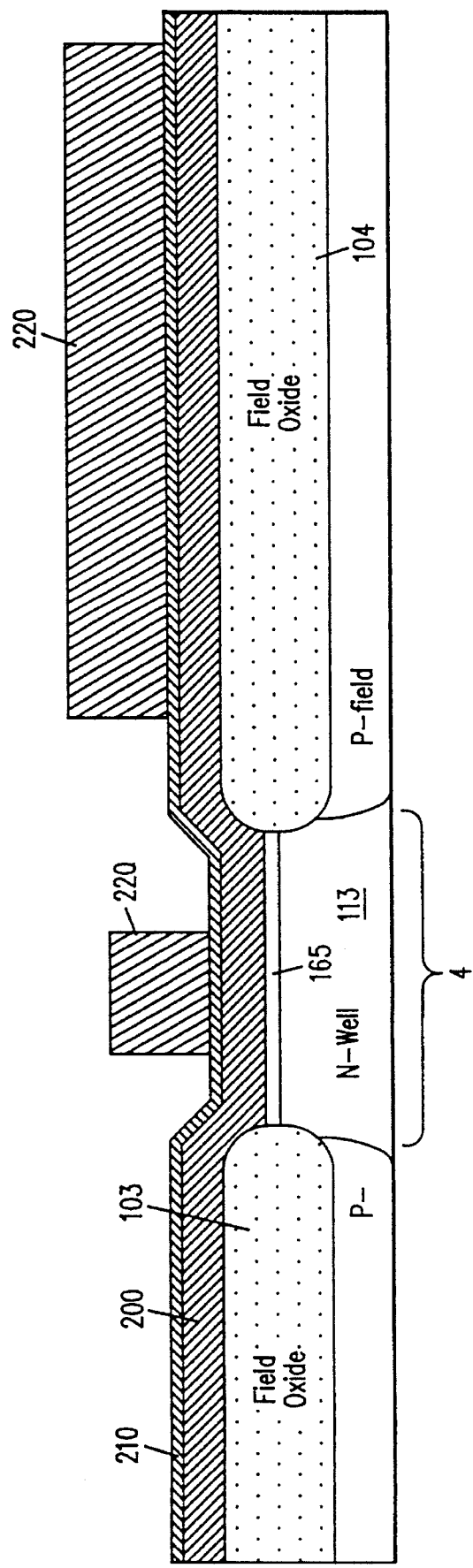

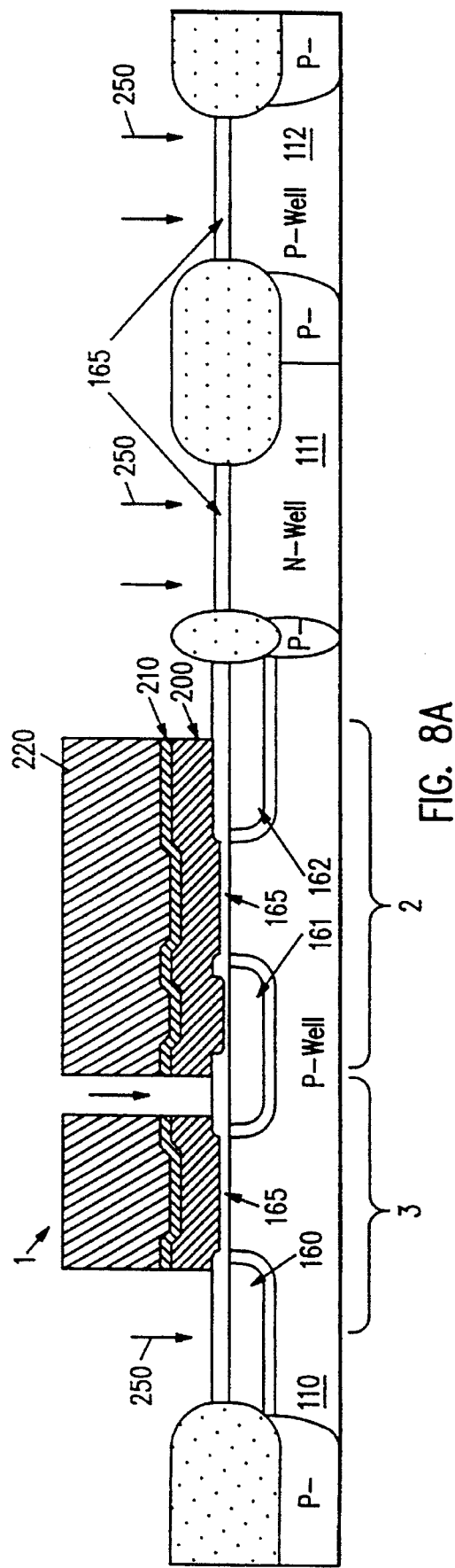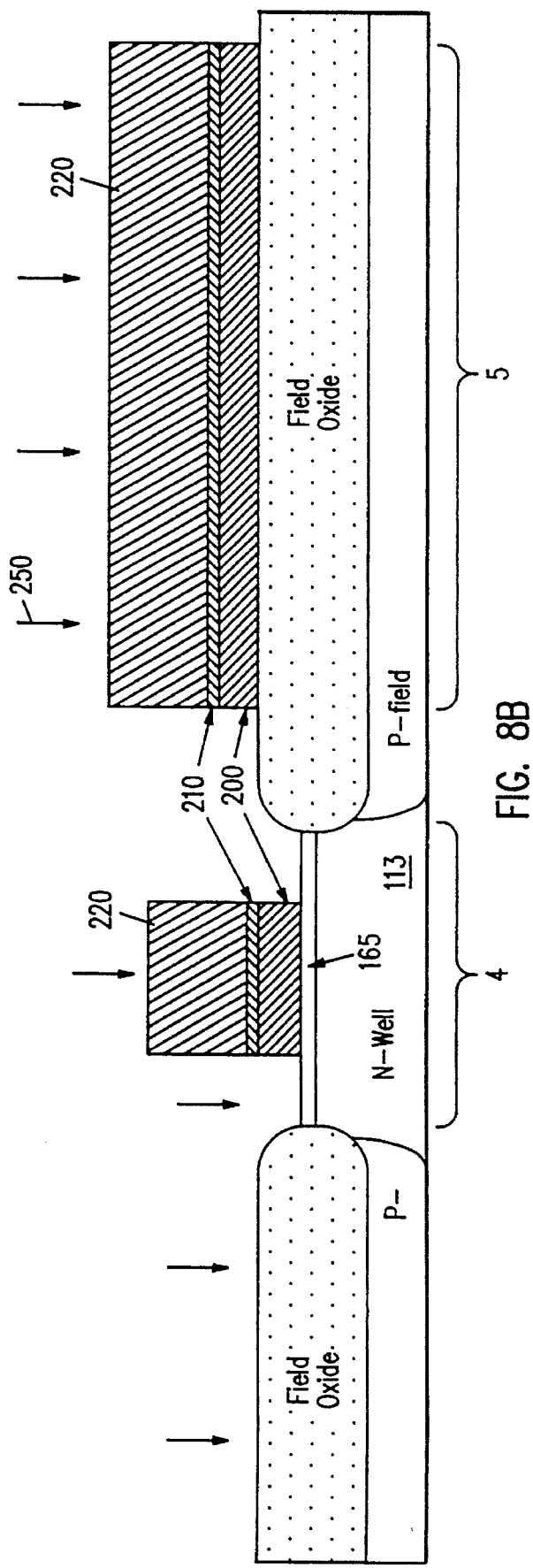

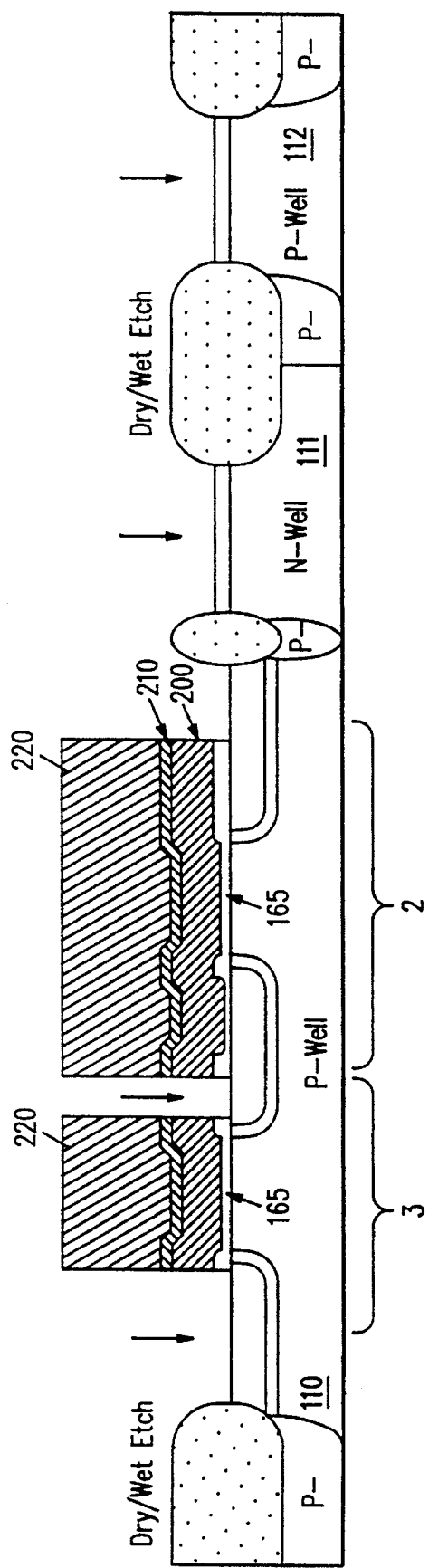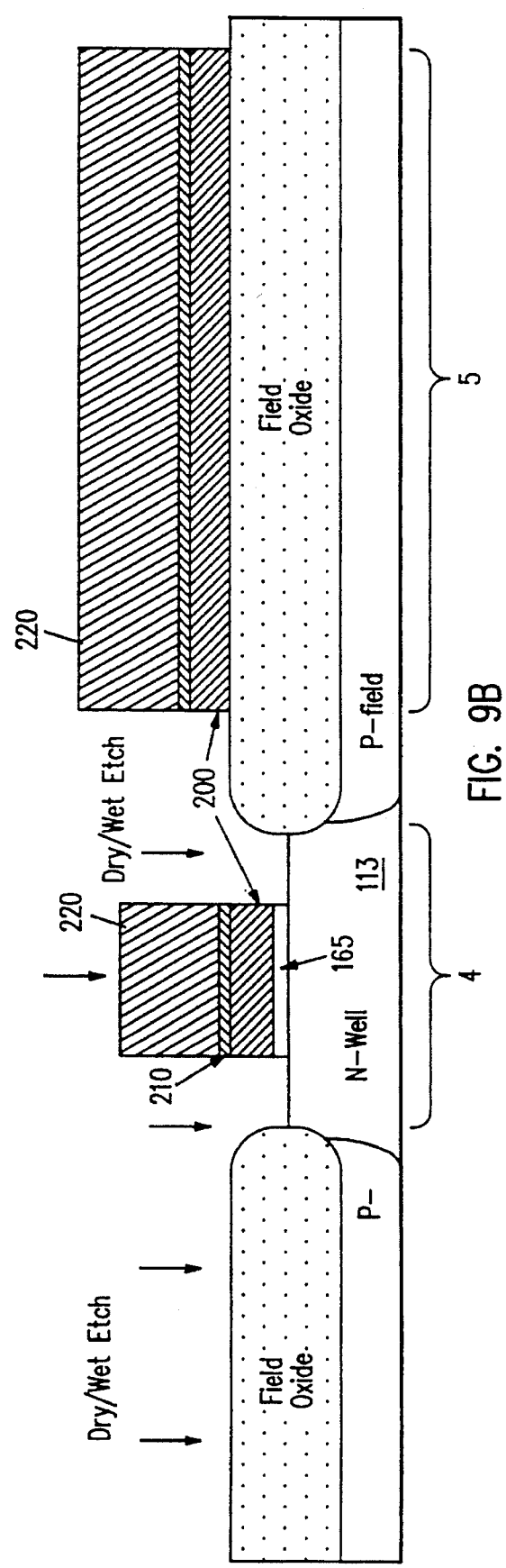
FIG. 9A
FIG. 9B

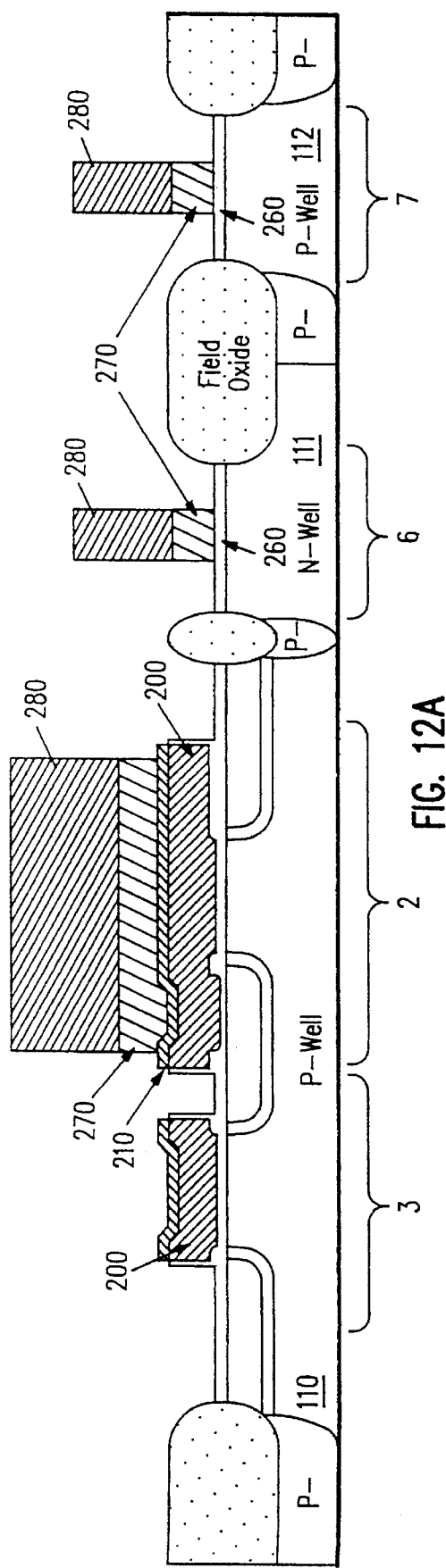
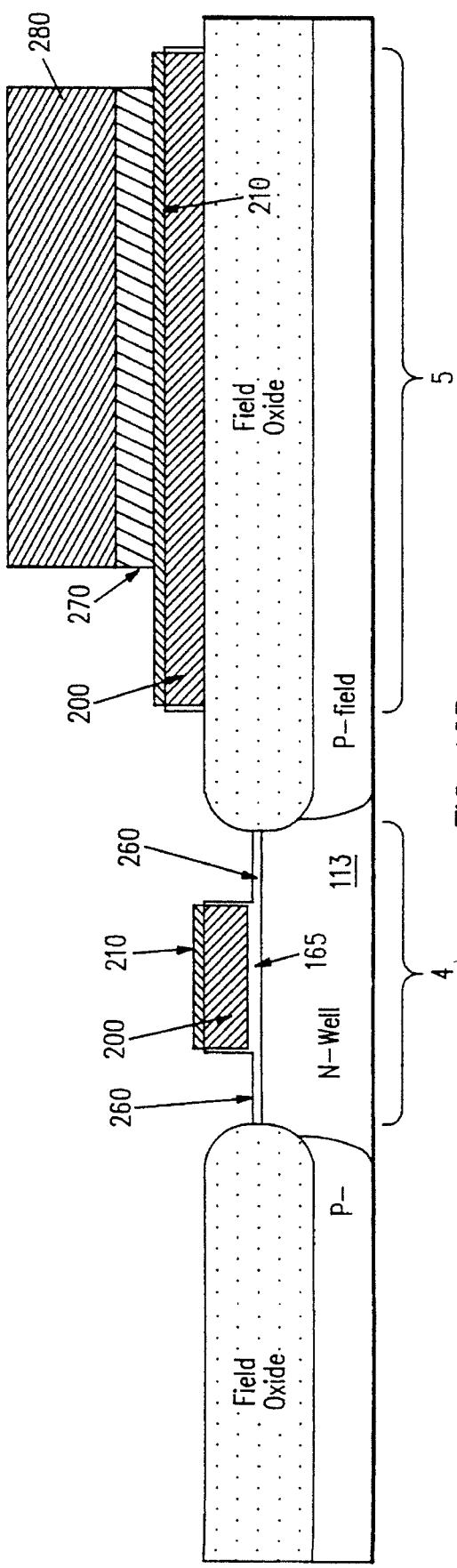
FIG. 12A
FIG. 12B

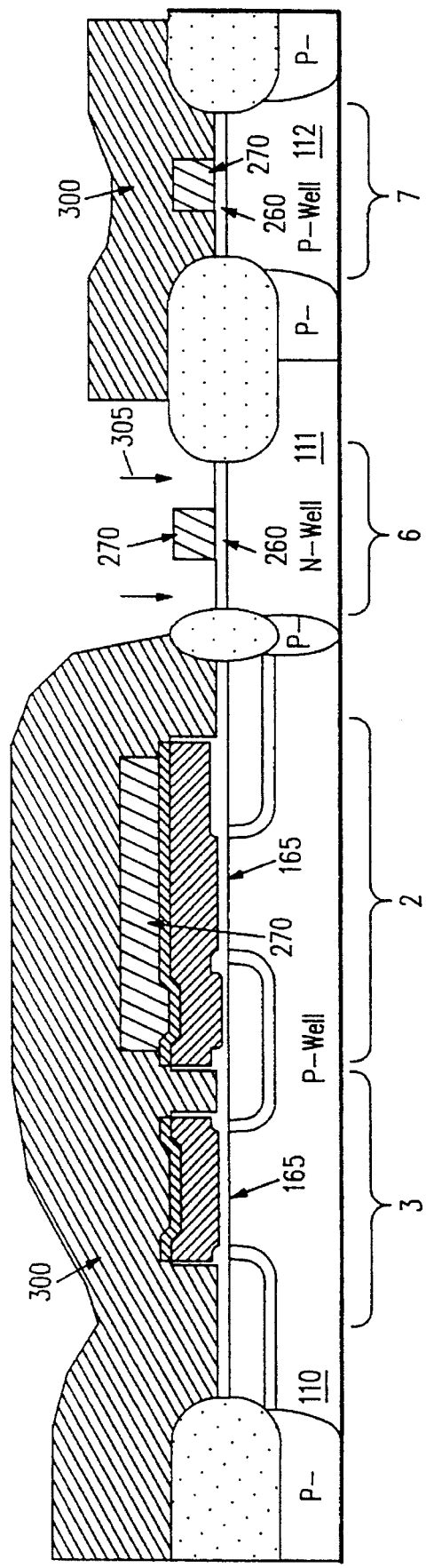
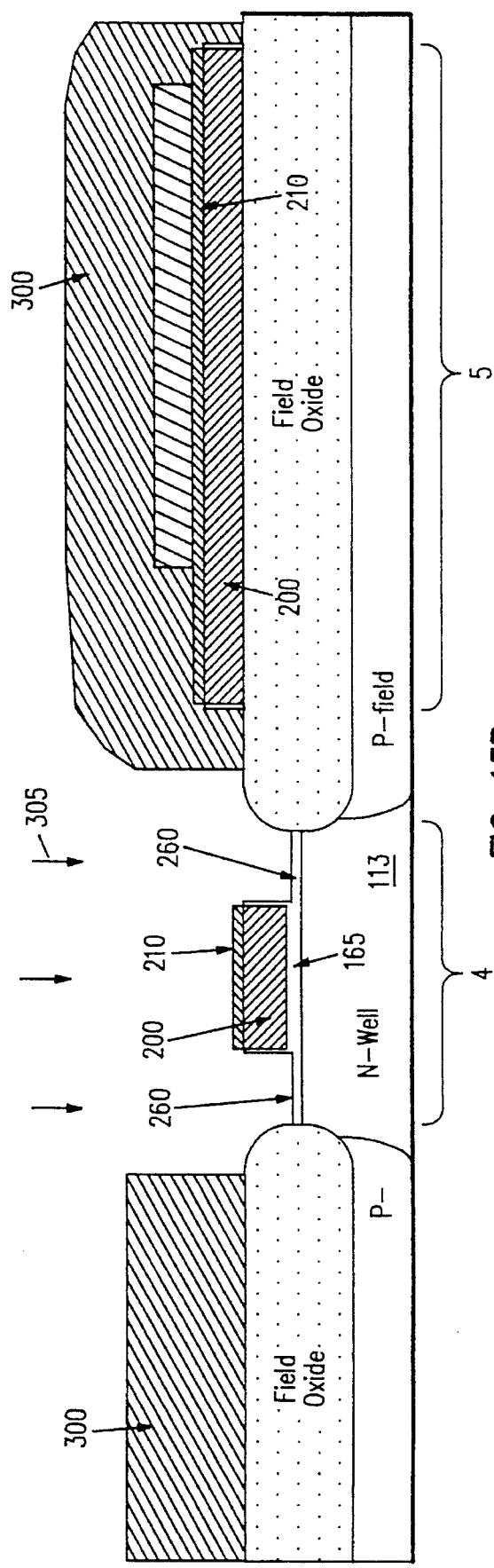
FIG. 13A
FIG. 13B

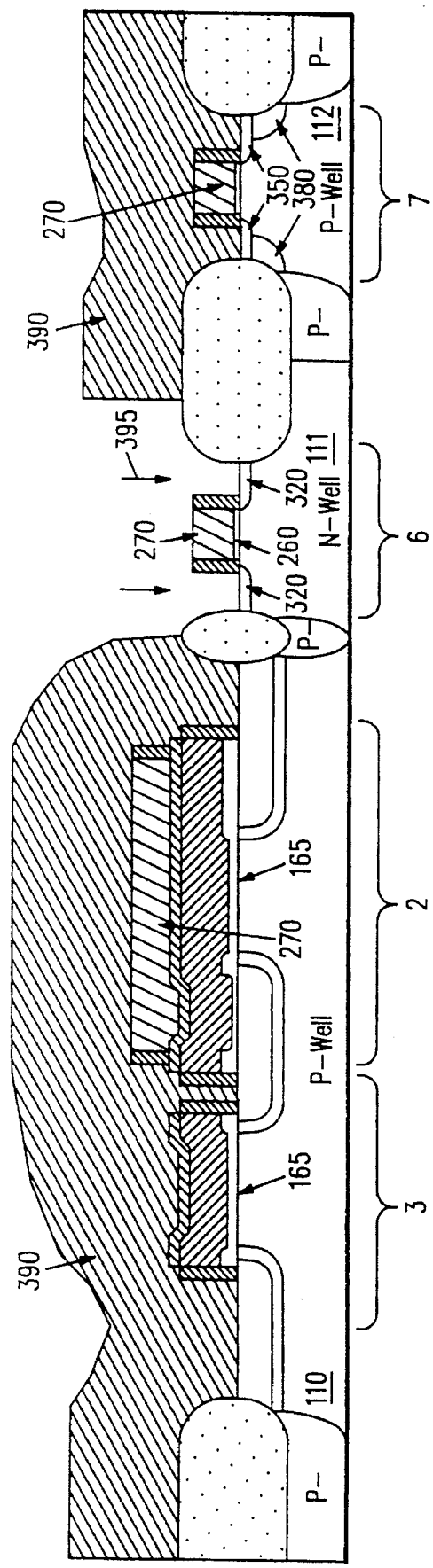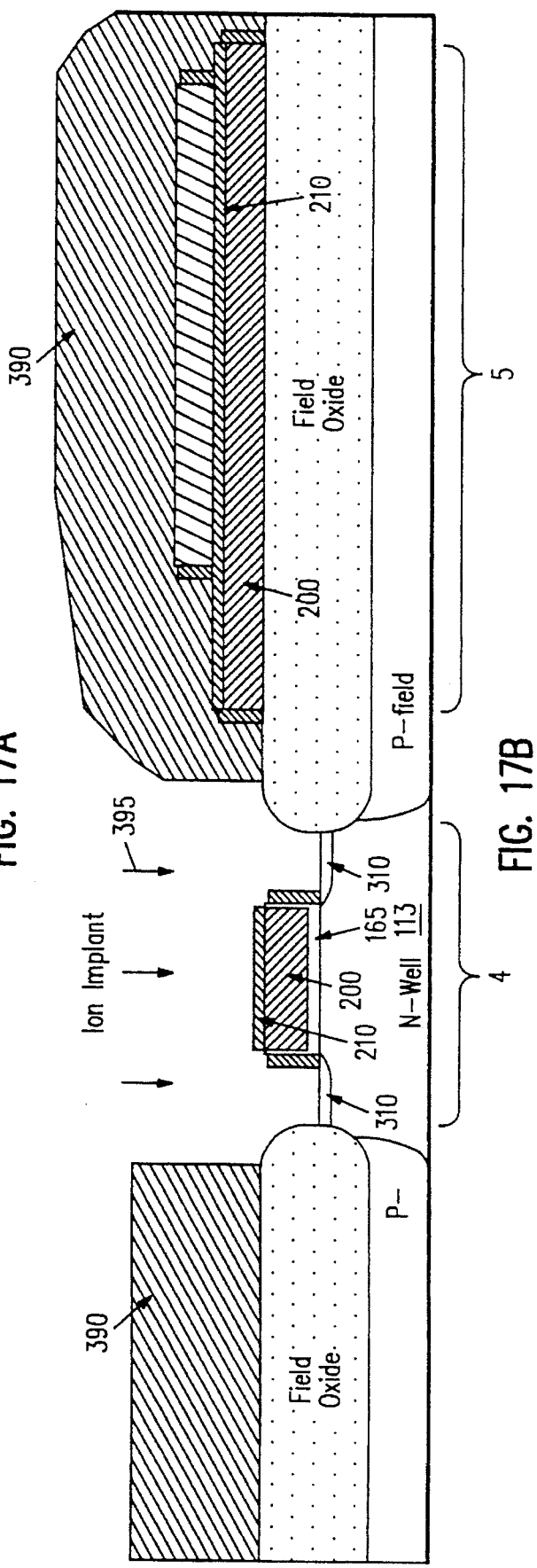
FIG. 17A
FIG. 17B

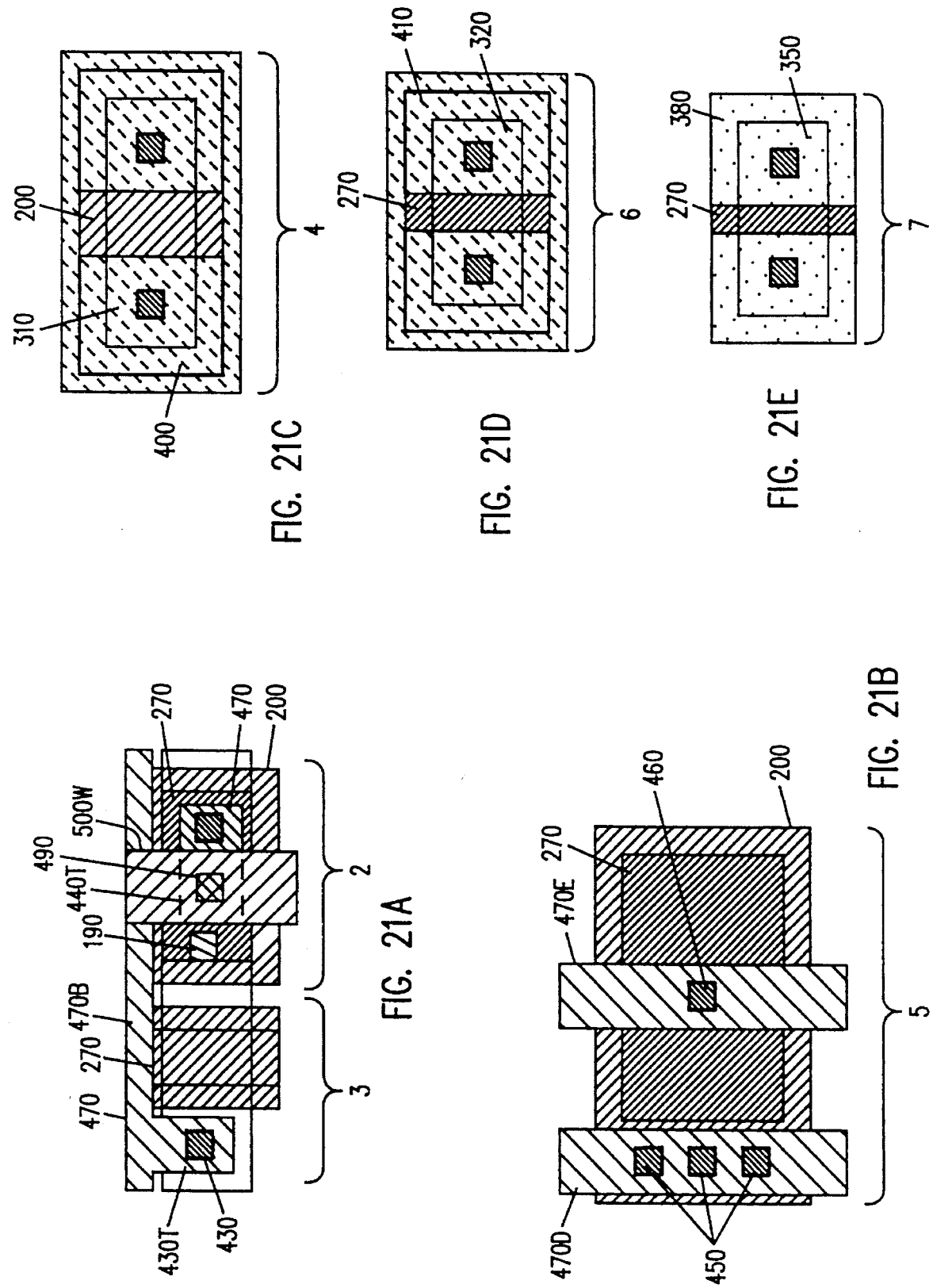

METHOD OF FABRICATING INTEGRATED CIRCUIT CHIP CONTAINING EEPROM AND CAPACITOR

This application is a division of application Ser. No. 08/298,239, filed Aug. 30, 1994, now abandoned.

FIELD OF THE INVENTION

This invention relates to integrated circuit chip fabrication and in particular to a method of fabricating an integrated circuit chip which contains CMOS devices as well as EEPROMs and capacitors.

BACKGROUND OF THE INVENTION

It is frequently desirable to include an electrically erasable programmable read-only-memory (EEPROM) in an integrated circuit (IC) chip. Examples are the "smart" analog chips used in antilock braking systems (ABS) and in data converters having an EEPROM-trimming architecture. Such chips typically contain a number of CMOS transistors as well as select transistors and memory transistors for the EEPROM cells. The memory transistors may include a single or double polysilicon layer.

A problem in the fabrication of these devices has been the large number of additional process steps, particularly masking steps, which are necessary in the fabrication of EEPROMs. An EEPROM fabricated with a single conductive (polysilicon) layer minimizes the number of extra processing steps, but this solution comes at the cost of an increased cell size. The density of double polysilicon layer EEPROM cells is typically greater than the density of single polysilicon layer EEPROM cells. In addition, use of two polysilicon layers allows the designer to include interpoly capacitors on the chip. High performance interpoly capacitors are particularly useful in the fabrication of data converters and precision capacitor circuits.

Another problem arises from the continuing reduction in the size of the CMOS devices. An EEPROM is normally programmed at a voltage of 15–17 V. With a 2.0 μm CMOS technology, the gate oxides and junctions of the CMOS devices are generally capable of withstanding such voltages. As the CMOS technology approaches the 1.0 μm scale, however, the CMOS transistors are not able to withstand the relatively high voltages necessary to program and erase the EEPROM cells. Accordingly, chips which contain extremely small scale logic devices typically have separate high voltage transistors to perform the bit line select gate function and otherwise interface with the EEPROM memory transistors. This adds more complexity to the fabrication process.

SUMMARY OF THE INVENTION

The process of this invention may be used to fabricate an array of EEPROM cells and an array of interpoly capacitors on a conventional logic IC chip, preferably a chip containing conventional CMOS devices. The process includes a first masking step to define the respective source/drain regions of an NMOS memory transistor and an NMOS select transistor in each of the EEPROM cells, a second masking step to define a tunnel window in a gate oxide in each of the memory transistors, and a third masking step to define a floating gate in each memory transistor and a gate of each select transistor. The third mask may also be used to define a gate of an additional high-voltage NMOS or PMOS transistor and a bottom electrode of a capacitor. A subsequent masking step is used to define a control gate of each memory transistor and the gates of the conventional logic devices, and may also be used to define the upper electrode of the capacitor. In this manner, the process of this invention limits the number of additional processing steps that are required in order to fabricate the EEPROM cells and capacitors.

BRIEF DESCRIPTION OF THE DRAWINGS

FIGS. 1A through 20A, 1B through 20B and 8C illustrate the steps of fabricating an IC logic chip including EEPROM cells and capacitors in accordance with this invention.

FIGS. 21A–21E illustrate plan views of the current elements included within the IC logic chips.

DESCRIPTION OF THE INVENTION

FIGS. 1A–20A and 1B–20B illustrate the process of this invention. Each pair of figures (e.g., FIGS. 1A and 1B) represent a cross-sectional view of a set of circuits formed in a single substrate, with the figure designated "A" representing a portion of the substrate to the left of the portion of the substrate shown in the figure designated "B". Thus, FIGS. 1A, 1B, etc., show the left hand portion of the substrate and FIGS. 1B, 2B, etc., show a the right hand portion of the substrate, with the right edge of each "A" figure coinciding with the left edge of the corresponding "B" figure. The circuit elements shown in FIGS. 1A–20A and 1B–20B are shown at the cross-sections indicated in the plan views of 21A–21E.

Figure 1A:
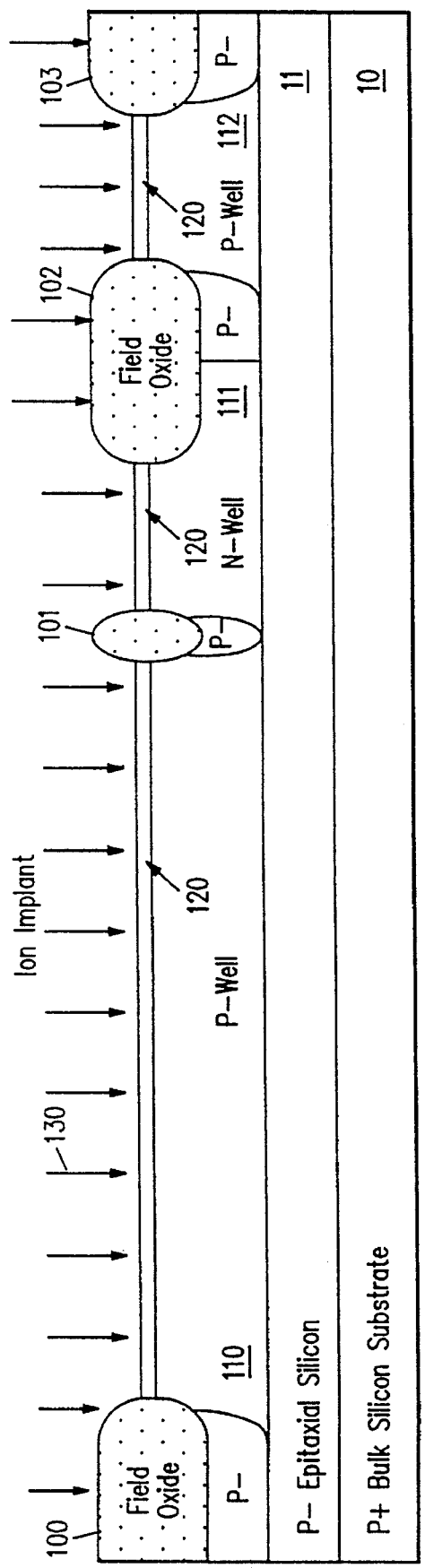
Figure 1B:
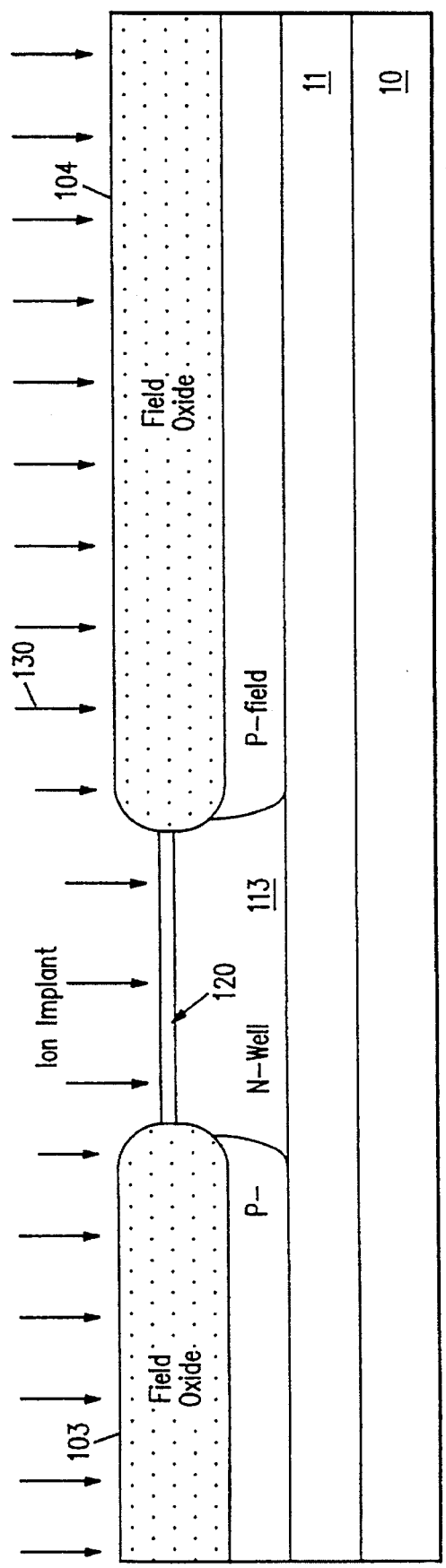

As shown in FIGS. 1A and 1B, the process begins with a P+ substrate 10 on which a P– epitaxial layer 11 is grown. Using techniques well known in the art, P-wells 110 and 112 and N-wells 111 and 113 are formed in epitaxial layer 11. Field oxide regions 100, 101, 102, 103 and 104 and P– field implant regions 100P, 101P, 102P, 103P and 1034P are also formed by means of processes known in the art. Field oxide region 101 and P– field implant region 101P isolate P-well 110 from N-well 111, field oxide region 102 and P– field implant region 102P isolate N-well 111 from P-well 112, and field oxide region 103 and P– field implant region 103P isolate P-well 112 from N-well 113.

The relatively high-voltage NMOS devices of an EEPROM cell will be formed in P-well 110, and conventional (5 volts, 150 Å gate thickness) CMOS devices will be formed in N-well 111 and P-well 112. An additional high-voltage PMOS device will be formed in N-well 113. A capacitor will be formed above field oxide region 104.

Referring further to FIGS. 1A and 1B, following field oxidation a sacrificial gate oxide layer 120 is formed on the surface of the substrate. A threshold voltage adjust implant (represented by arrows 130) for the high-voltage devices to be formed within P-well 110 and N-well 113 is performed through sacrificial gate oxide layer 120. This implant is conducted without a mask and contains the entire dose necessary for setting the threshold voltages of the high-voltage devices within P-well 110 and N-well 113. The high-voltage devices will have gate oxides that are relatively thick (for example, 325 Å). Threshold voltage adjust implant 130 also contains part of the implant dose that is required to adjust the threshold voltages of the low-voltage CMOS devices to be formed within N-well 111 and P-well 112.

Figure 2A:
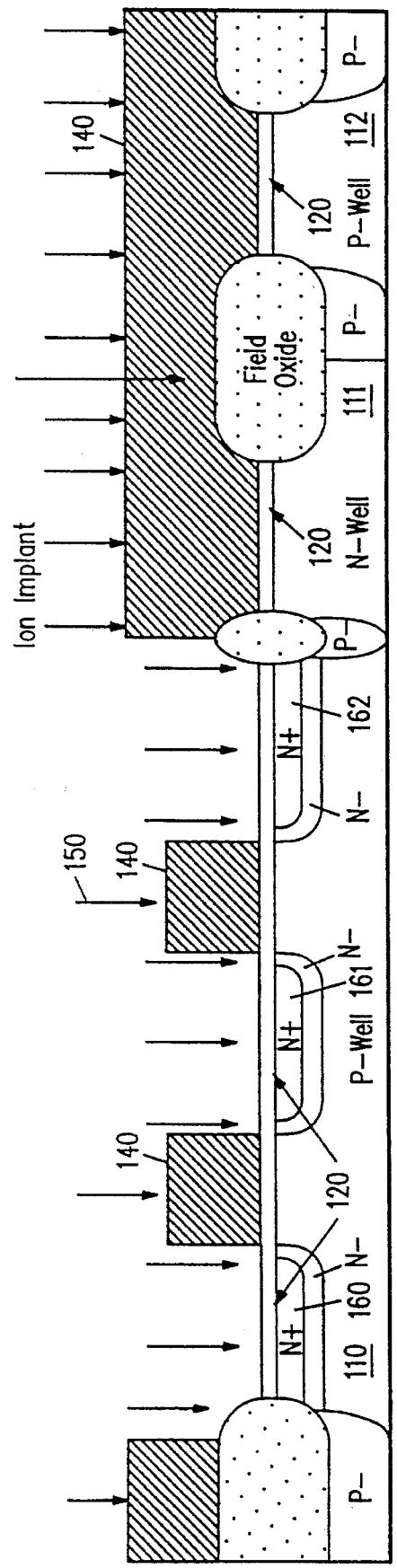
Figure 2B:
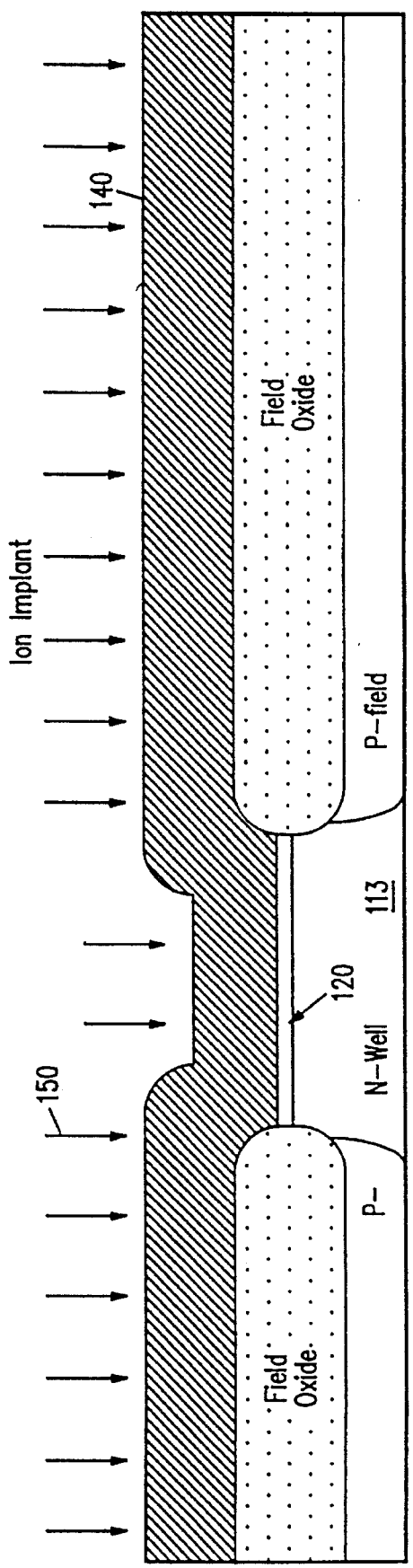

Referring next to FIGS. 2A and 2B, a first photoresist mask 140 is then applied to the surface of the substrate. An N-type implant 150 is performed through mask 140 to form source/drain regions 160, 161 and 162 within P-well 110. Implant 150 consists of two stages (phosphorus and arsenic dopants) so that source/drain regions 160, 161 and 162 are double-diffused, having an N+ region and a deeper surrounding N− region. Implant 150 may be performed with arsenic at a dosage of $1\times10^{15}$ cm$^{-2}$ and phosphorus at a dosage of $1\times10^{14}$ cm$^{-2}$.

Figure 3A:
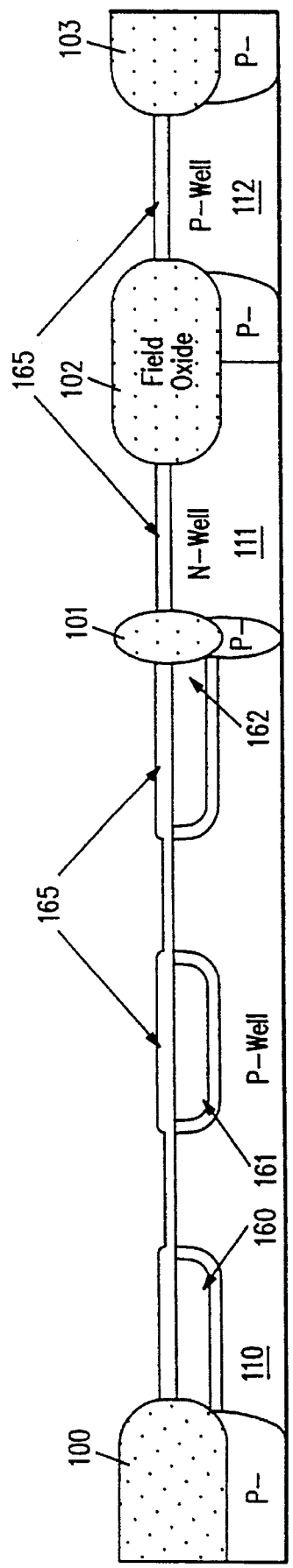
Figure 3B:
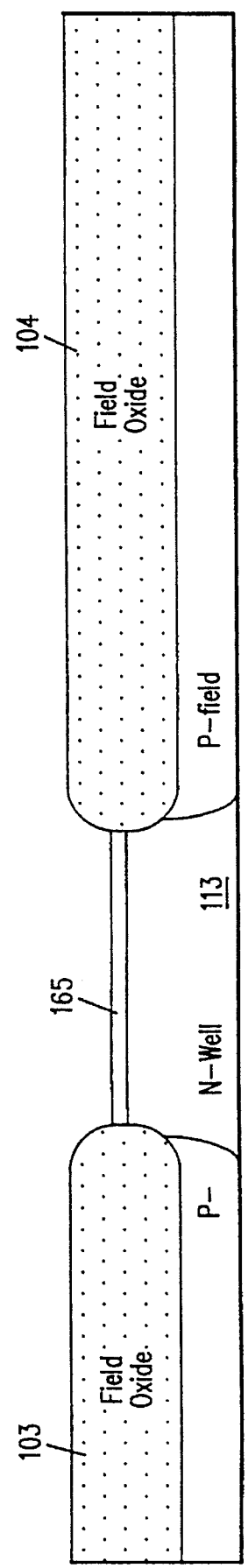
Figure 5A:
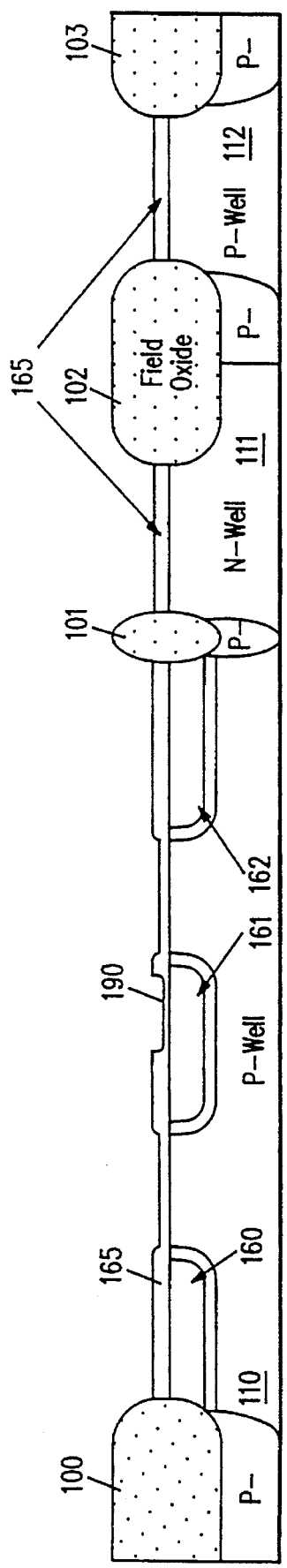
Figure 5B:
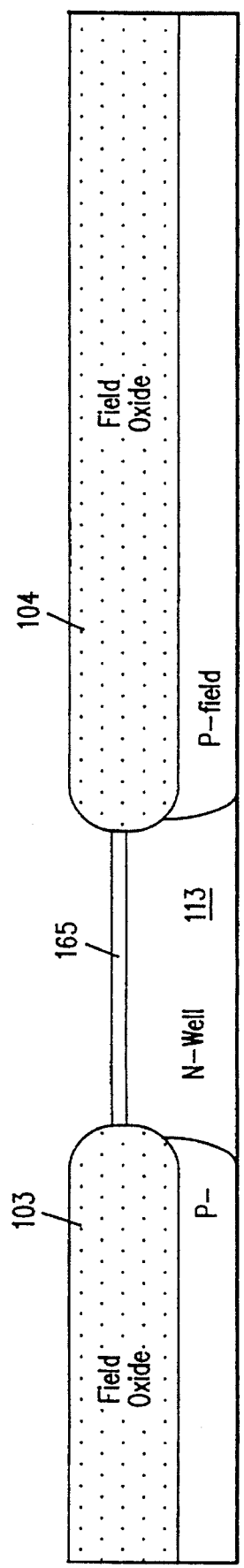

The mask 140 and sacrificial gate oxide layer 120 are then removed. A gate oxide layer 165 is grown, as shown in FIGS. 3A and 3B. Gate oxide layer 165 may be approximately 400 Å thick but is somewhat thicker (for example, 600 Å) over source/drain regions 160, 161 and 162. As shown in FIGS. 4A and 4B, a second, tunnel oxide mask 170 is formed over all of gate oxide layer 165 except a portion thereof above source/drain region 161. A wet etch 180, using a buffered oxide etch (BOE), is then performed to remove the portion of oxide layer 165 which lies under the opening in mask 170. Mask 170 is then removed and, as shown in FIGS. 5A and 5B, a tunnel oxide layer 190 is grown over the exposed portion of source/drain region 161. Tunnel oxide 190 is typically about 83 Å thick and adds slightly to the thickness of oxide layer 165 in the other regions.

As shown in FIGS. 6A and 6B, a first polysilicon layer 200 is then deposited over the entire surface of the substrate. Polysilicon layer 200 is doped with POCl$_3$ to approximately 40 ohms per square. An oxide-nitride-oxide (ONO) layer 210 is then deposited on polysilicon layer 200. The ONO layer may be approximately 260 Å thick.

As shown in FIGS. 7A and 7B, a third mask 220 is then deposited over ONO layer 210 and over portions of polysilicon layer 200 that will form a floating gate of a memory transistor 2 and a gate of a select transistor 3, which together will form an EEPROM cell 1 within P-well 110. Mask 220 is also deposited over portions of polysilicon layer 200 that will form a gate of a high-voltage PMOS transistor 4 in N-well 113 and the lower electrode of a capacitor 5 above field oxide layer 104.

As shown in FIGS. 8A and 8B, polysilicon layer 200 and ONO layer 210 are then etched from all regions except those which underlie mask 220. Oxide layer 165 serves as an etch stop for the two-stage plasma etch.

A boron implant 250 is then conducted to adjust the threshold voltages of the low-voltage CMOS devices to be formed in N-well 111 and P-well 112. The dosage of implant 250 may be approximately $3\times10^{12}$ cm$^{-2}$. In N-well 111 and P-well 112, implant 250 supplements the doping which resulted from the prior threshold adjust implant 130 (FIGS. 1A and 1B). Oxide layer 165 serves as a screen oxide for implant 250.

With mask 220 still remaining, the exposed portions of gate oxide layer 165 are then removed. A two-step dry/wet etch is the preferred method of removing oxide layer 165 so as to avoid the undercutting of the floating gate of memory transistor 2 (polysilicon layer 200) that may occur if a single wet etch is used. Such undercutting forms cavities under the edges of the floating gate and may create problems when a second polysilicon layer is deposited and etched (as described below), since the second polysilicon layer will fill the cavities beneath the floating gate and polysilicon residues or "stringers" may be formed when the second polysilicon layer is later anisotropically etched. These stringers can short out the transistor devices, rendering the circuits inoperable. A similar problem occurs in the oxide strata of ONO layer 210. The edges of these strata are etched back by the wet etchant. This can pose a reliability problem.

A solution to this problem is to use a two-step dry/wet etch. First, an anisotropic etch (e.g., using an etchant based on a halocarbon gas such as C$_2$F$_6$) is employed to partially etch the oxide layer to a thin layer (e.g., 70 to 90 Å thick). This etch may be done in the same etch chamber as the first polysilicon layer 200, or in a different chamber. Next, a wet etch is performed to remove the remaining gate oxide. This etch is performed for the minimum time necessary to remove the oxide layer in order to minimize the undercutting of the floating gate.

Figure 8C:
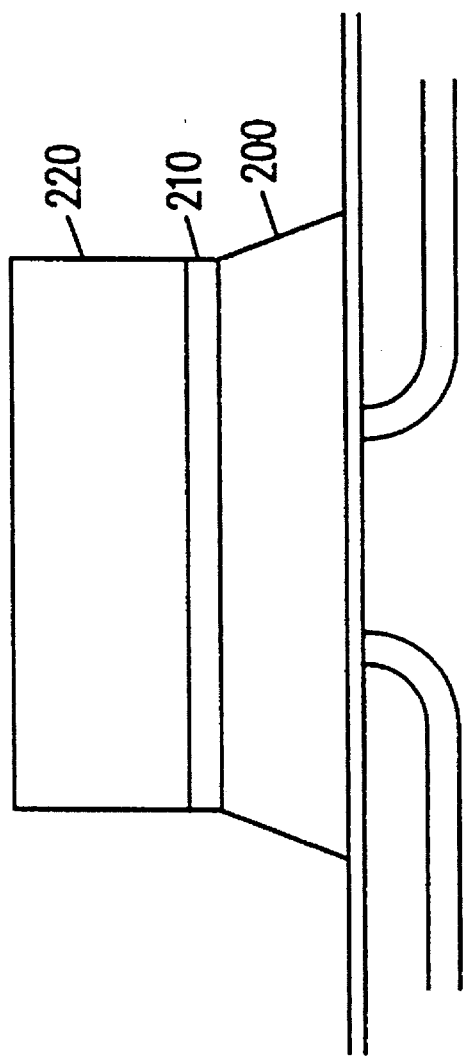

To further minimize the undercutting of the floating gate, the etching of polysilicon layer 200 to form the floating gate may be carried out with an etchant that produces a sloped sidewall for the floating gate (see FIG. 8C). The etch used to generate the sloped sidewall may be one in which etch inhibitors are generated. The etch inhibitors are deposited on the sidewalls, thereby producing the sloped profile of the floating gate. An etchant based on a gas chemistry of HCl may be used.

The structure that remains after oxide layer 165 is etched as shown in FIGS. 9A and 9B.

Figure 10A:
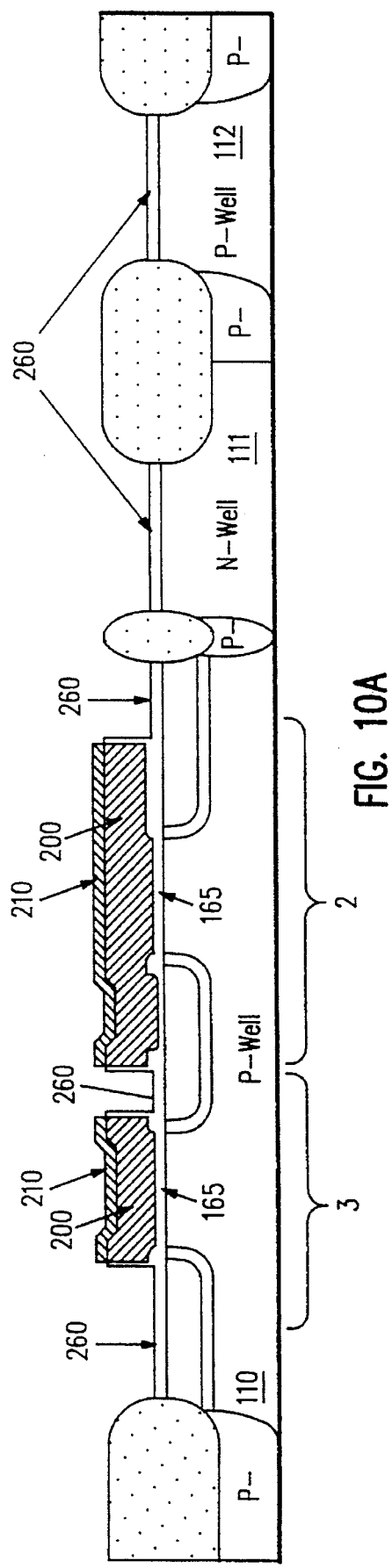
Figure 10B:
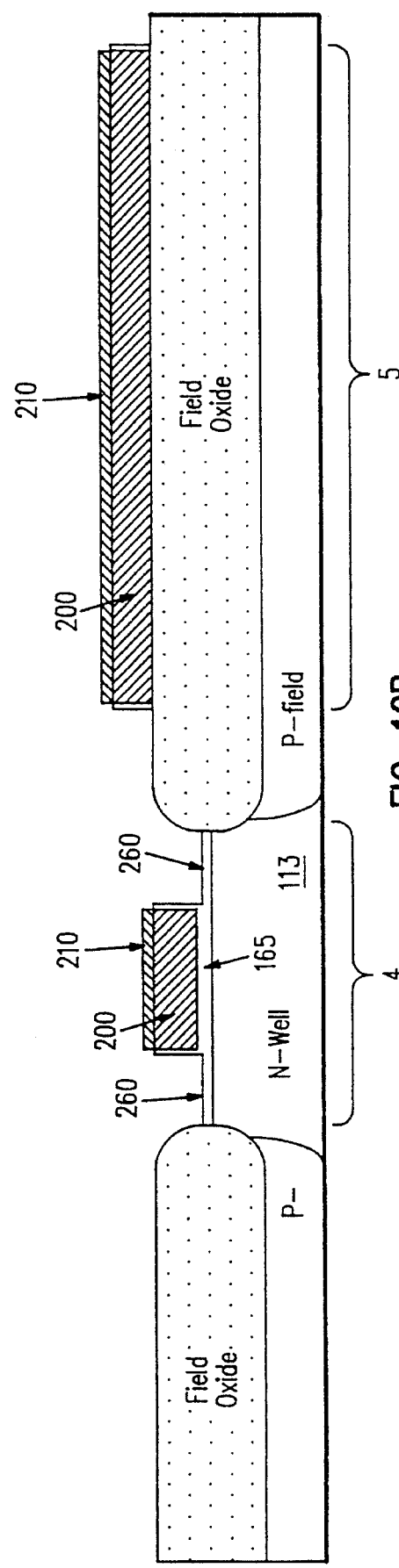

As shown in FIGS. 10A and 10B, mask 220 is then removed, leaving ONO layer 210 exposed, and a gate oxide layer 260 is grown. Oxide layer 260 may be approximately 150 Å thick. Oxide layer 260 grows to a thickness of approximately 300 Å on the exposed sidewalls of polysilicon layer 200.

Figure 11A:
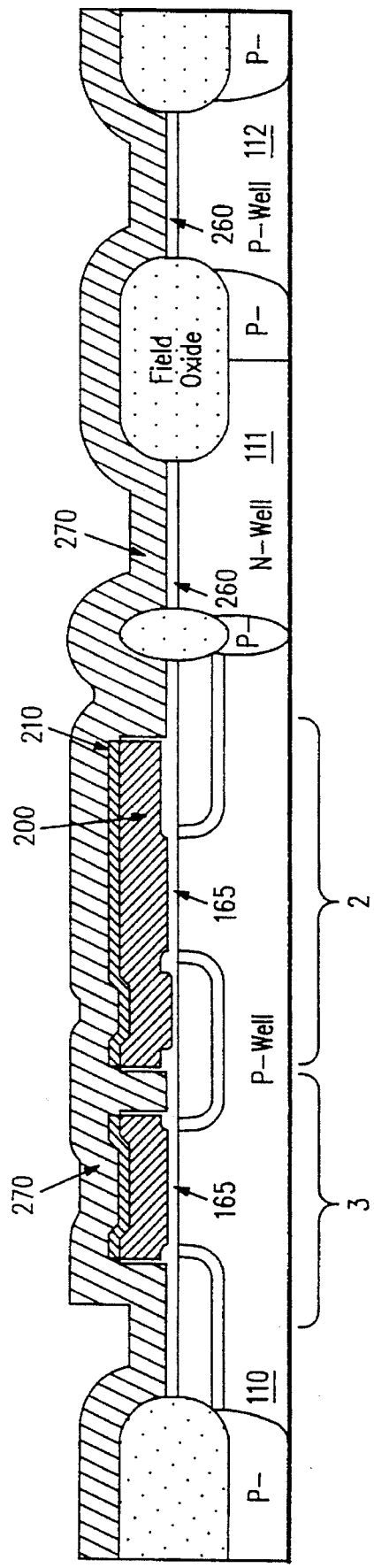
Figure 11B:
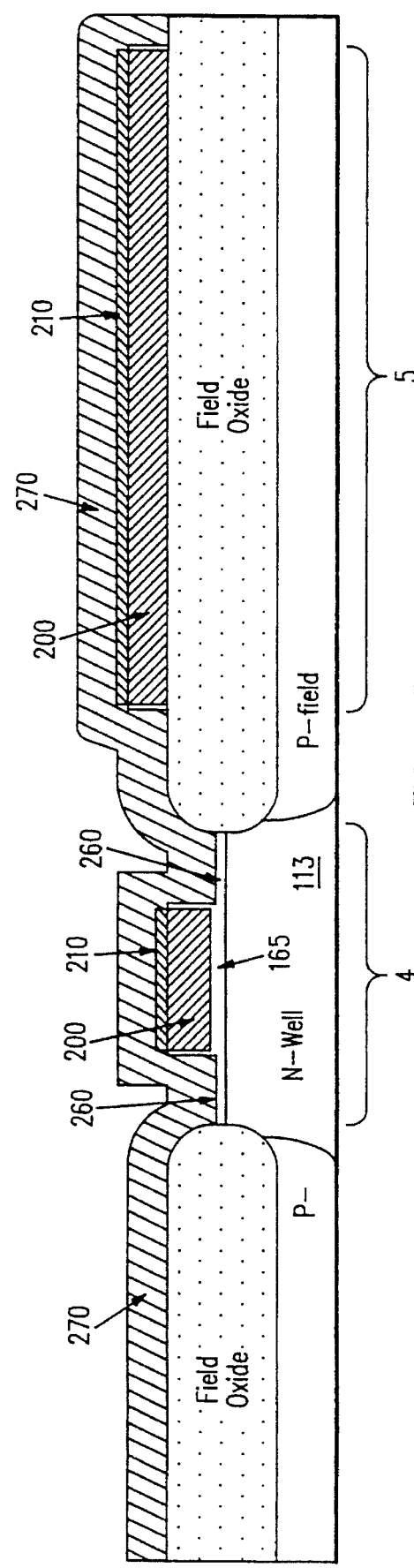

As shown in FIGS. 11A and 11B, a second polysilicon layer 270 is then deposited over the entire surface of the structure. A mask 280, shown in FIGS. 12A and 12B, is then deposited over portions of polysilicon layer 270 that are to form a control gate of memory transistor 3 and the gates of a low-voltage PMOS transistor 6 to be formed in N-well 111 and a low-voltage NMOS transistor 7 to be formed in P-well 112, respectively. Mask 280 is also deposited over a portion of polysilicon layer 270 that is to form the upper electrode of capacitor 5. Polysilicon layer 270 is then etched, preferably using a two-stage etching process which includes an anisotropic etch followed by an isotropic etch. The isotropic etch is used to remove any stringers from second polysilicon layer 270 that may have formed along the edges of first polysilicon layer 200. It will be noted that the control gate (layer 270) of memory transistor 230 is made somewhat smaller than the floating gate (layer 200). This is the case on all sides, as is evident from FIG. 21A, yielding a peripheral region of the floating gate which extends outward beyond the edges the control gate. Since oxide layer 260 is only about 300 Å thick on the vertical edges of the floating gate, "underlapping" the edges of the control gate in this manner prevents shorting in this area. The 300 Å thickness of oxide layer 260 is not by itself sufficient to withstand the biases of 15–17 V commonly found in EEPROM cells.

Similarly, the top electrode (polysilicon layer 270) of capacitor 5 is "underlapped" (see FIG. 21B). This is the preferred structure for capacitor 5 for capacitive matching and leakage considerations.

Next, as shown in FIGS. 13A and 13B, mask 280 is removed, and a mask 300 is applied over all areas except N-wells 111 and 113. A P-type lightly-doped drain ion implant 305 is then performed into the source/drain regions of high-voltage PMOS transistor 4 and low-voltage PMOS transistor 6. The lightly-doped drain regions in high-voltage PMOS transistor 4 are designated by the reference numeral 310 in FIG. 14B, and the lightly-doped drain regions for PMOS transistor 6 are designated 320 in FIG. 14A. Ion implant 305 may be BF$_2$.

Figure 14A:
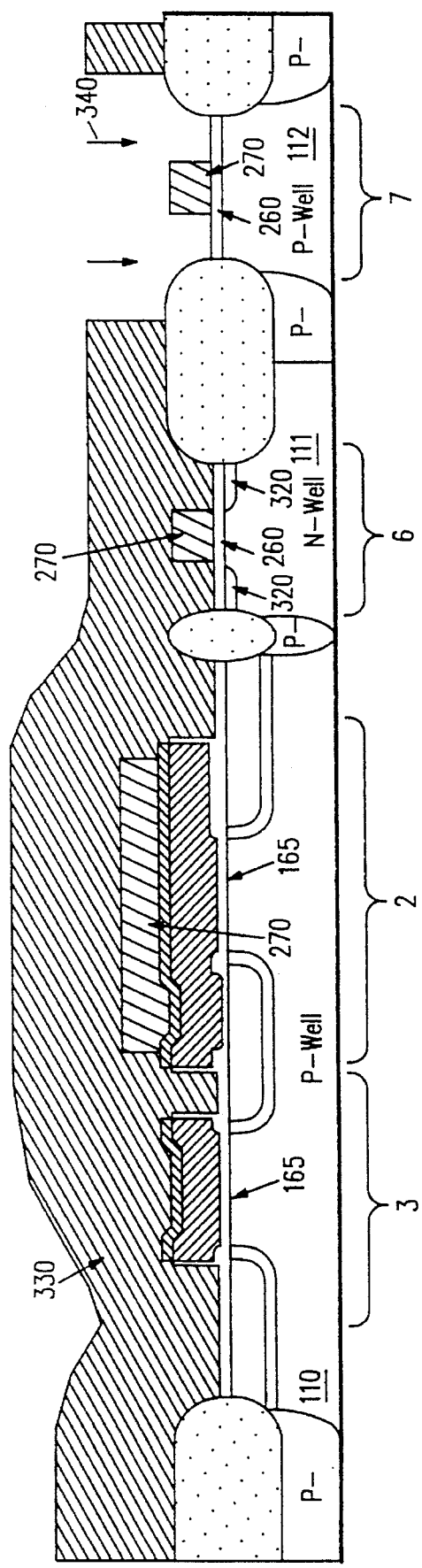
Figure 14B:
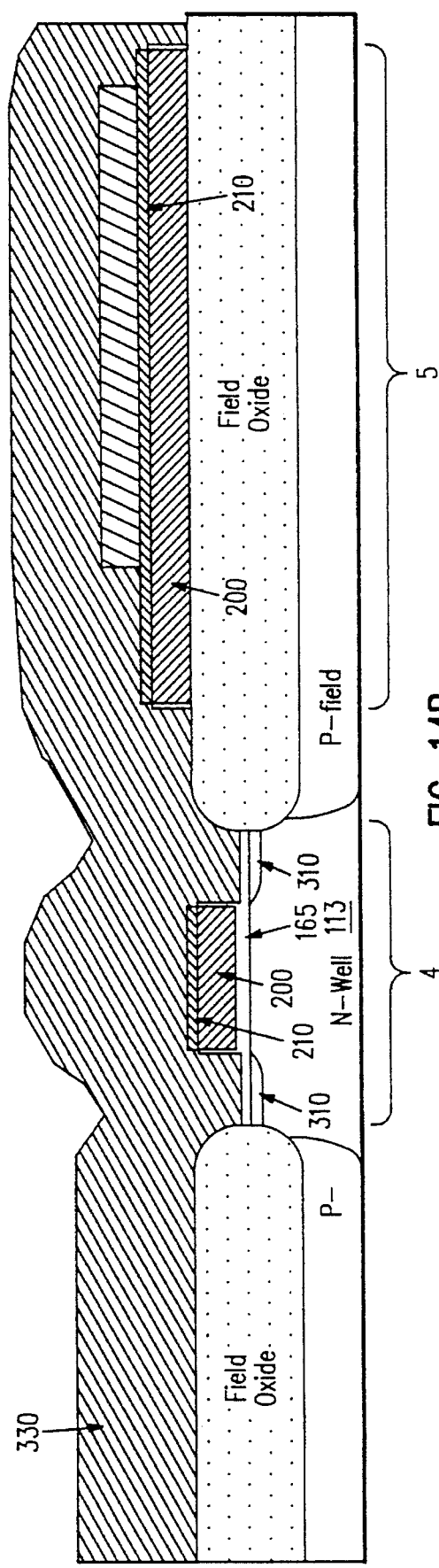
Figure 15A:
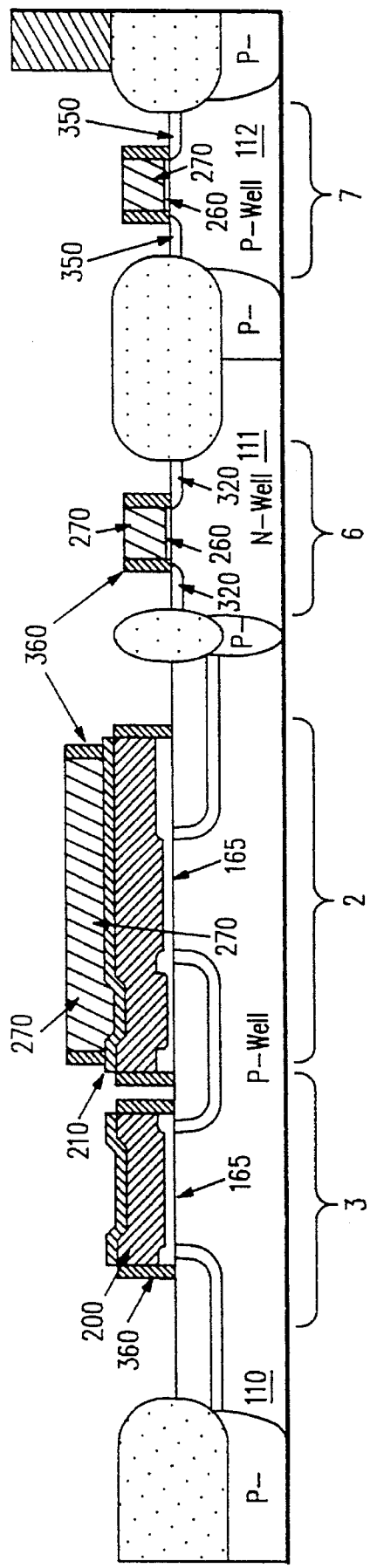
Figure 15B:
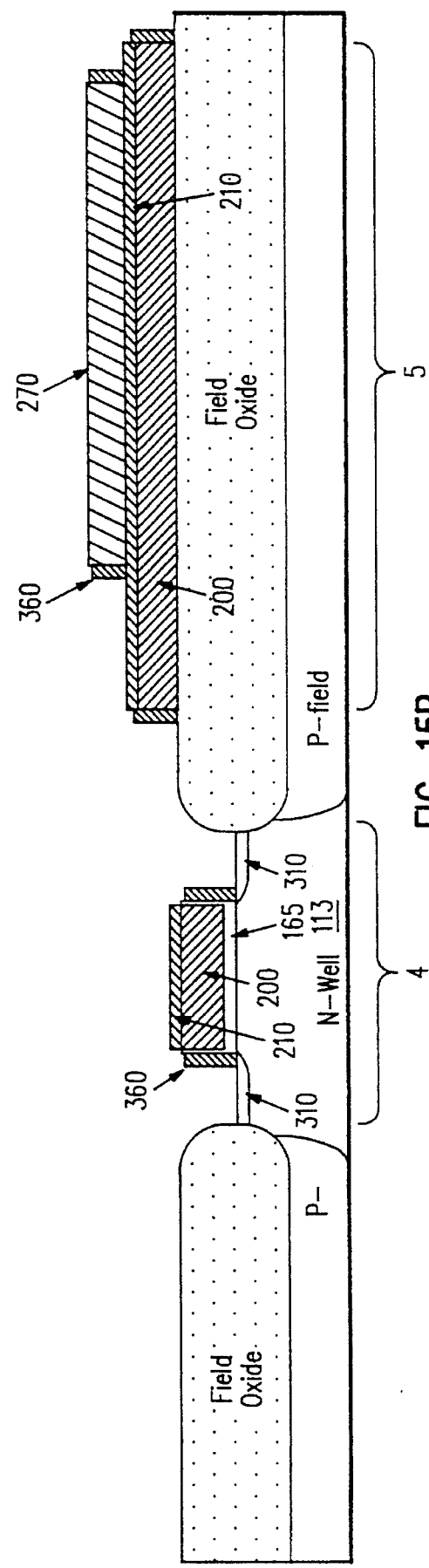

Mask 300 is then removed and, as further shown in FIGS. 14A and 14B, a mask 330 is deposited over all areas except P-well 112. A lightly-doped drain ion implant 340 is conducted into the source/drain regions of low-voltage NMOS transistor 7, forming the lightly-doped drain regions 350 shown in FIG. 15A. Conventional techniques involving deposition and etchback are done to form spacers 360 shown in FIGS. 15A and 15B. Ion implant 340 may be phosphorus.

Figure 16A:
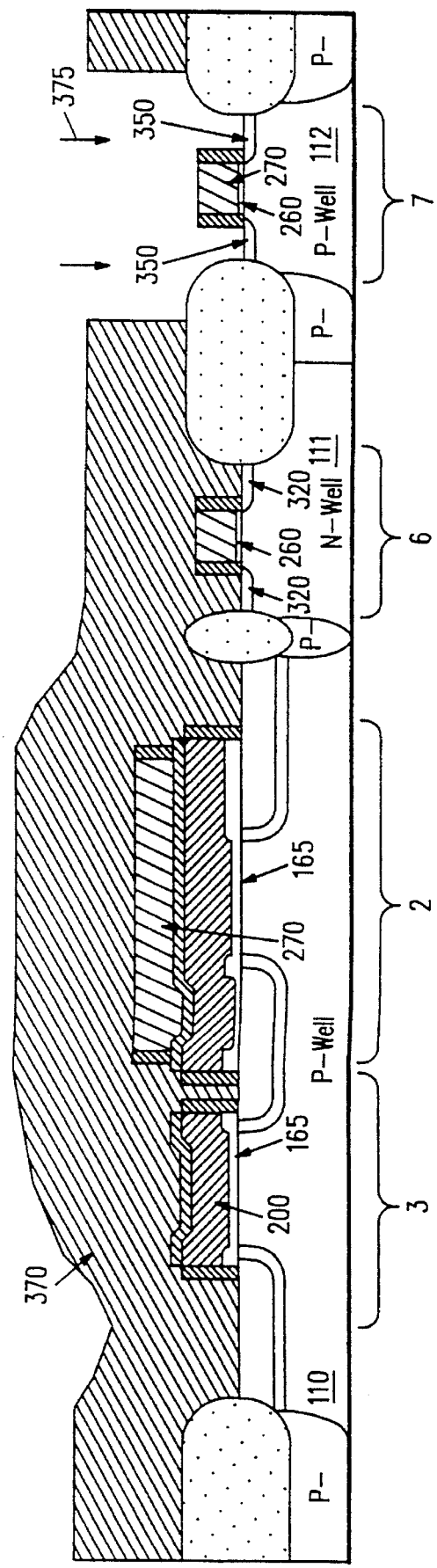
Figure 16B:
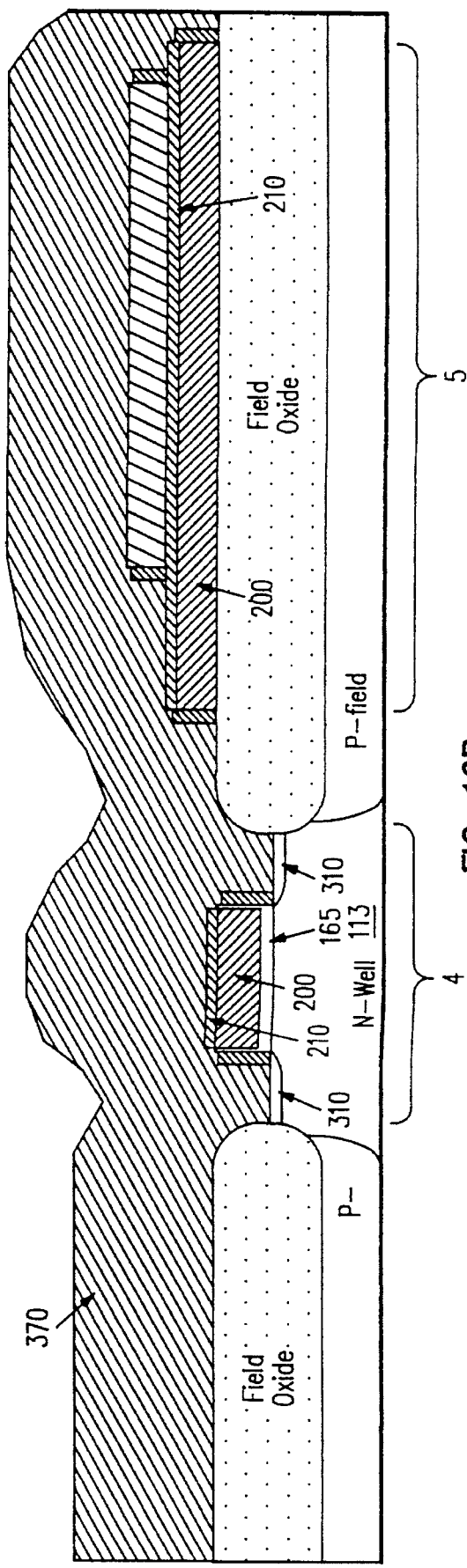

As shown in FIGS. 16A and 16B, a mask 370 is applied over all areas except P-well 112, and a conventional N+ ion implant 375 is performed to form the heavily-doped regions of the source and drain of low-voltage NMOS transistor 7, both of which are designated by the reference numeral 380 in FIG. 17A. The N+ source/drain regions 380 are then annealed. Following the removal of mask 370, a mask 390 is deposited over all areas except N-wells 111 and 113, as shown in FIGS. 17A and 17B. A conventional P+ ion implant 395 is performed to form the source and drain regions 400 of high-voltage PMOS transistor 4 and the source and drain regions 410 of low-voltage PMOS transistor 6. Source/drain regions 400 and 410 are shown in FIGS. 18A and 18B.

Figure 18A:
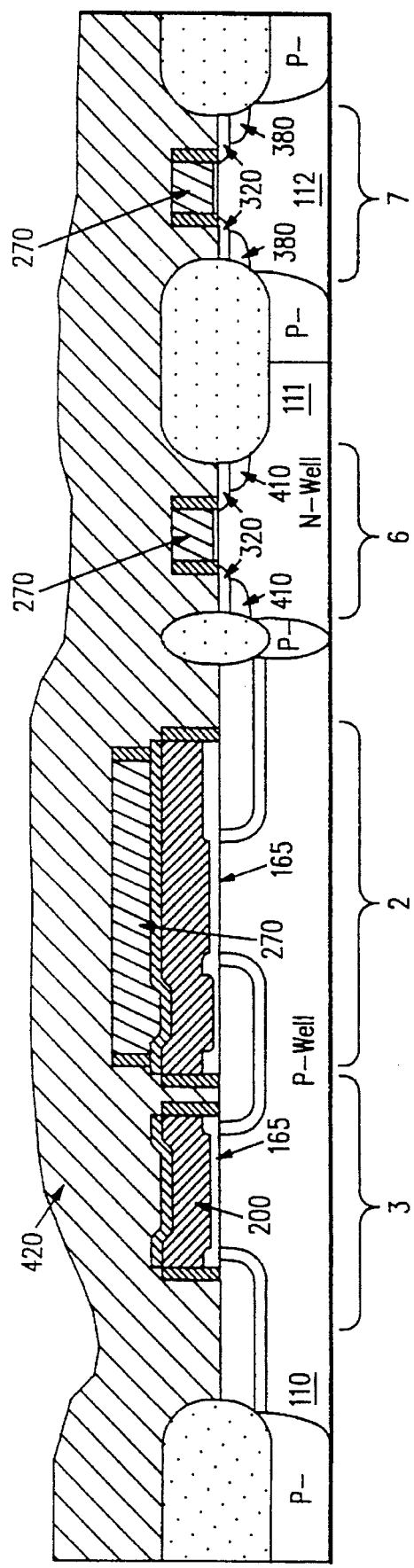
Figure 18B:
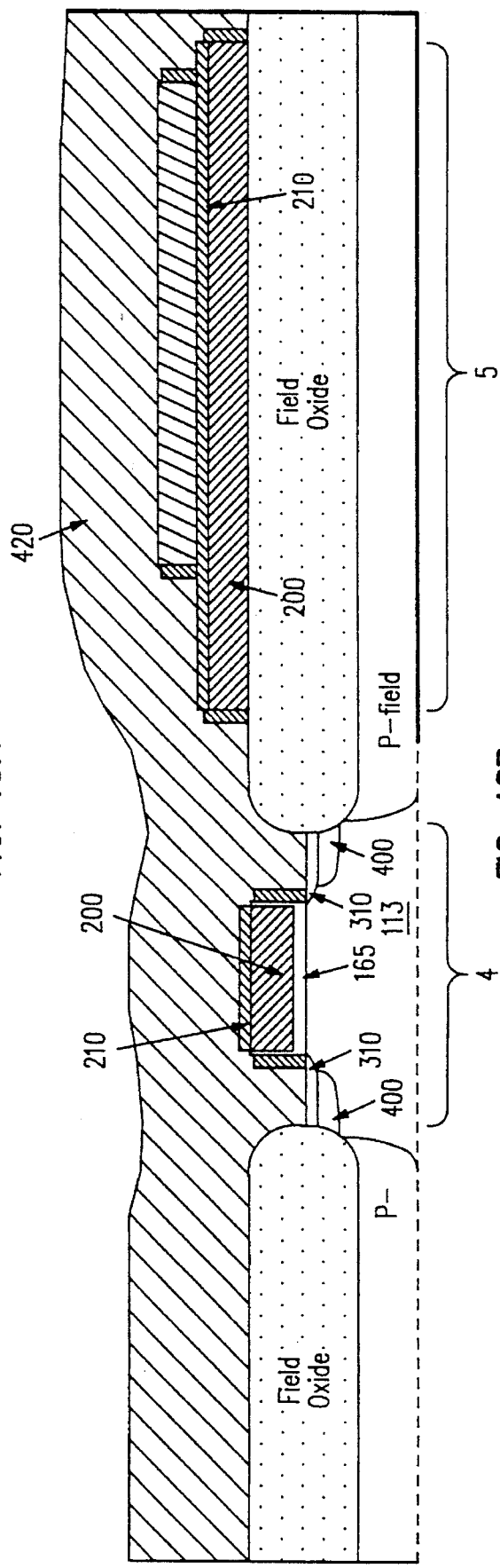
Figure 19A:
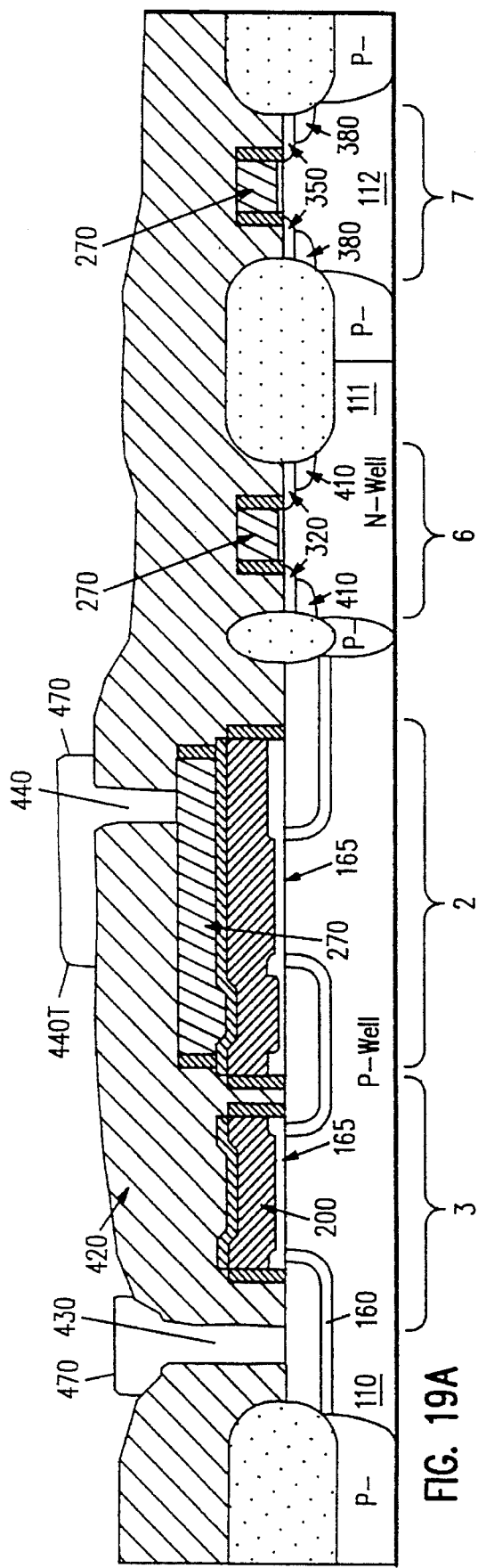
Figure 19B:
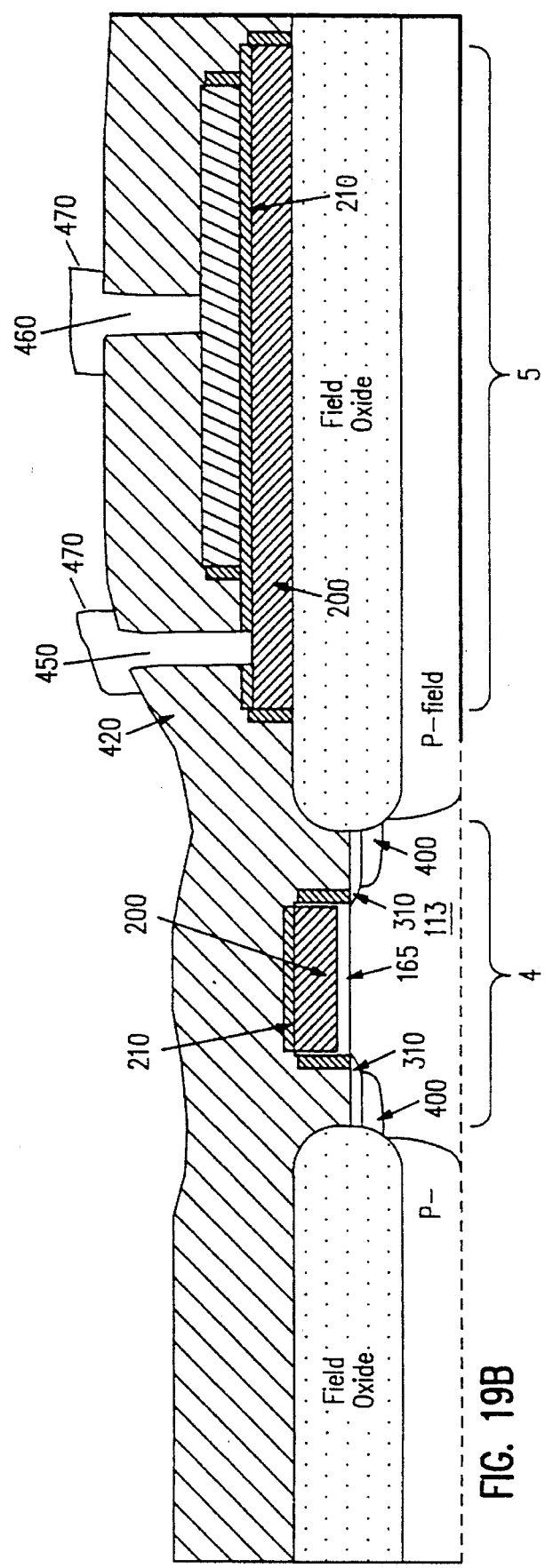

Mask 390 is removed and, as shown in FIGS. 18A and 18B, a first dielectric layer 420 is deposited over the entire structure. As shown in FIGS. 19A and 19B, contacts are formed through dielectric layer 420 as follows: a contact 430 is opened to source/drain region 160 of select transistor 3; a contact 440 is opened to the control gate of memory transistor 2 (formed from polysilicon layer 270); three contacts 450 are opened to the bottom electrode of capacitor 5 (formed from polysilicon layer 200); and a contact 460 is opened to the top electrode of capacitor 5 (formed from polysilicon layer 270). Contacts 450 are visible in the plan view of FIG. 21B.

A first metal layer 470 is then deposited and patterned, as shown in FIGS. 19A and 19B and FIGS. 21A and 21B. As shown in FIGS. 19A and 21A, first metal layer 470 includes a tab 430T which extends from via 430 and a tab 440T which extends from via 440. Tab 430 runs to a bit line 470B, which provides an electrical connection to the source/drain region 160 of select transistor 3. Bit line 470B extends across the chip and makes connection in a similar manner to the select transistors of other EEPROM cells. First metal layer 470 also includes a line 470D which connects through vias 450 to the bottom electrode of capacitor 5, and a line 470E which connects through via 460 to the upper electrode of capacitor 5. Lines 470D and 470E are illustrated in FIG. 21B.

Figure 20A:
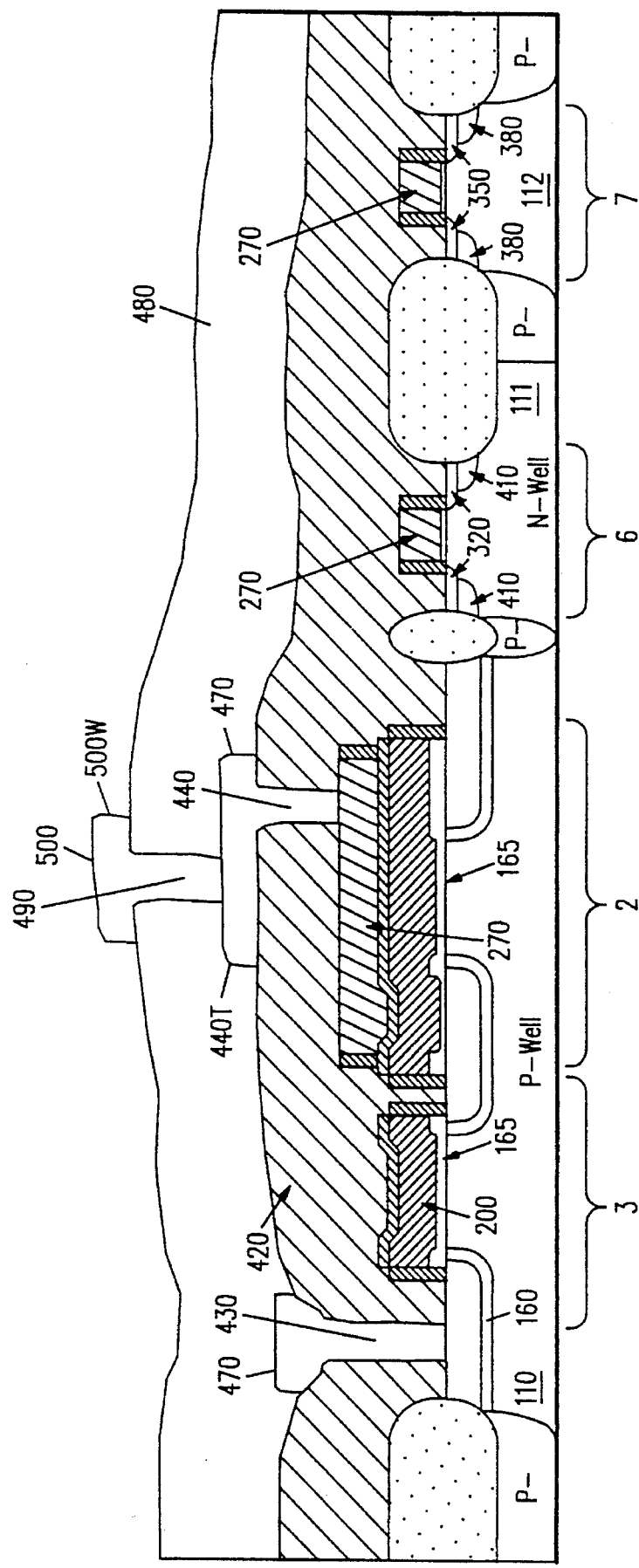
Figure 20B:
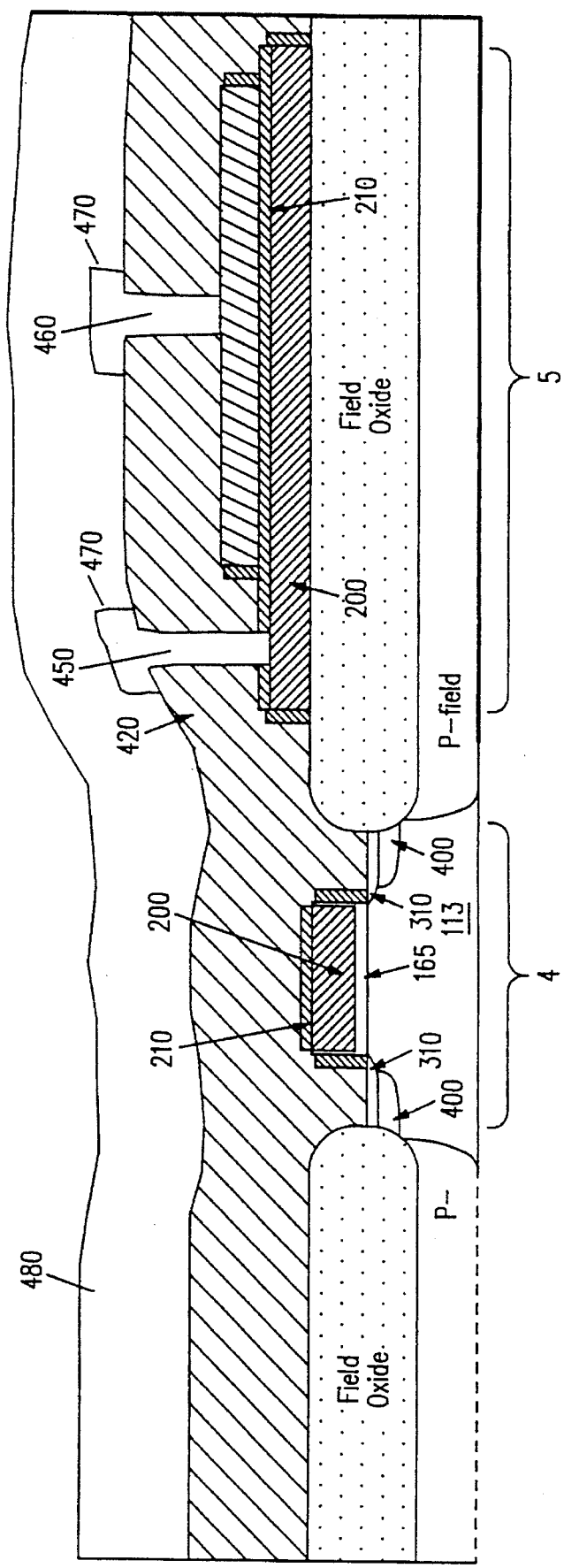

Next, as shown in FIGS. 20A and 20B, a second dielectric layer 480 is deposited over the entire structure. A via 490 is opened directly above tab 440T, and a second metal layer 500 is deposited and patterned on the surface of second dielectric layer 480. As is evident in FIG. 21A, the patterning of metal layer 500 forms a word line 500W which extends perpendicular to bit line 470B. By means of vias 440 and 490 and tab 440T, word line 500W connects to the control gate of memory transistor 2. Following the deposition of second metal layer 500, a conventional passivation layer (not shown) is deposited.

FIGS. 21C, 21D and 21E illustrate plan views of high-voltage NMOS transistor 4 and the pair of low-voltage CMOS transistors 6 and 7, respectively.

The foregoing embodiment is intended to be illustrative and not limiting. Numerous alternative embodiments in accordance with this invention will be apparent to those skilled in the art, and all such alternative embodiments are intended to be included within the scope of this invention, which is defined in the following claims.

I claim:

1. A process of fabricating a memory transistor, said process comprising the steps of:

providing a semiconductor substrate:

forming a pair of source/drain regions at a surface of said substrate, said source/drain regions being separated by a channel region;

forming a gate oxide layer over said source/drain regions and said channel region;

etching said gate oxide layer to expose a portion of said surface of said substrate, said portion comprising a tunnel oxide region, said tunnel oxide region overlying one of said source/drain regions;

growing a tunnel oxide layer in said tunnel oxide region;

depositing a first conductive layer over said gate oxide layer and said tunnel oxide layer;

depositing an insulating layer over said first conductive layer;

forming a first mask over said insulating layer;

etching said insulating layer in areas thereof not covered by said first mask;

etching said first conductive layer to form a floating gate, said floating gate covering said tunnel oxide region and having a peripheral edge which surrounds said tunnel oxide region;

depositing a second conductive layer over said insulating layer;

forming a second mask over said second conductive layer; and etching said second conductive layer in areas thereof not covered by said second mask to form a control gate, said control gate being sized and positioned such that a peripheral region of said floating gate extends laterally outward beyond said control gate along an entire length of said peripheral edge of said control gate.

2. The process of claim 1 including the further step of forming a MOSFET in said substrate, including the step of forming a second gate oxide layer for said MOSFET after the formation of said floating gate, said second gate oxide layer growing on a sidewall of said floating gate.

3. The process of claim 1 wherein said step of etching said first conductive layer to form a floating gate produces a floating gate having a sloped sidewall.

4. The process of claim 1 comprising the further step of etching said gate oxide layer after said floating gate is formed, using a two-step etch including a dry anisotropic etch followed by a wet etch.

* * * * *